(12) United States Patent
Jerez et al.

(10) Patent No.: US 12,496,659 B2
(45) Date of Patent: *Dec. 16, 2025

(54) METHOD OF OPTIMIZING LASER CUTTING OF WAFERS FOR PRODUCING INTEGRATED CIRCUIT DIES

(71) Applicant: Skyworks Solutions, Inc., Irvine, CA (US)

(72) Inventors: Juan Arturo Jerez, Mexicali (MX); Miguel Camargo Soto, Mexicali (MX); Luis Enrique Velazquez Cardenas, Mexicali (MX)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/341,651

(22) Filed: Jun. 26, 2023

(65) Prior Publication Data

US 2023/0415269 A1    Dec. 28, 2023

Related U.S. Application Data

(63) Continuation of application No. 16/838,249, filed on Apr. 2, 2020, now Pat. No. 11,701,739.

(Continued)

(51) Int. Cl.
*H01L 21/302*    (2006.01)
*B23K 26/36*    (2014.01)
(Continued)

(52) U.S. Cl.
CPC ............ *B23K 26/36* (2013.01); *H01L 21/302* (2013.01); *H10D 84/01* (2025.01); *B23K 2103/56* (2018.08); *H01L 23/544* (2013.01)

(58) Field of Classification Search
CPC .................. B23K 26/36; B23K 2103/56; B23K 2101/40; B23K 26/38; B23K 26/402;
(Continued)

(56) References Cited

U.S. PATENT DOCUMENTS 6,420,245 B1 * 7/2002 Manor .................. B28D 5/022
                                                     438/460
6,555,447 B2 * 4/2003 Weishauss ............. B28D 5/022
                                                     438/460

(Continued)

FOREIGN PATENT DOCUMENTS

CN     105269146 A  *  1/2016  ......... B23K 26/0604
CN     111299866 A  *  6/2020  ....... H01L 21/67092

(Continued)

*Primary Examiner* — Mohammed Shamsuzzaman
(74) *Attorney, Agent, or Firm* — Knobbe, Martens, Olson & Bear, LLP (57) ABSTRACT

A method for separating integrated circuit dies from a wafer includes making at least two cutting passes with a laser along a first die street of an integrated circuit die, the first die street extending along a first axis on the wafer. The method also includes making at least two cutting passes with the laser along a second die street of the integrated circuit die, the second die street extending along a second axis on the wafer that is generally perpendicular to the first axis. In one process, three cutting passes are made with the laser alternatingly along the first and second die streets to separate the integrated die circuit along the first and second axes. In another process, two cutting passes are made with the laser along the first die street in opposite directions, and two cutting passes are then made with the laser along the second die street in opposite directions.

14 Claims, 7 Drawing Sheets

Related U.S. Application Data (60) Provisional application No. 62/833,220, filed on Apr. 12, 2019.

(51) Int. Cl.
  *H10D 84/01* (2025.01)
  *B23K 103/00* (2006.01)
  *H01L 23/544* (2006.01)

(58) Field of Classification Search
  CPC ..... H01L 21/302; H01L 21/82; H01L 23/544; H01L 21/78
  See application file for complete search history.

(56) References Cited

U.S. PATENT DOCUMENTS

| | | | |
|---|---|---|---|
| 6,562,698 B2 * | 5/2003 | Manor | B28D 5/0011 438/460 |
| 6,943,429 B1 * | 9/2005 | Glenn | H01L 23/544 257/E23.179 |
| 6,945,844 B2 * | 9/2005 | Hubbell, III | B28D 5/0064 451/10 |
| 7,153,186 B2 * | 12/2006 | Popescu | H01L 21/67092 451/6 |
| 7,709,768 B2 * | 5/2010 | Sercel | B23K 26/40 219/121.75 |
| 7,795,116 B2 * | 9/2010 | Dydyk | H01L 21/78 438/460 |
| 7,977,601 B2 * | 7/2011 | Kandt | B23K 26/0869 219/121.75 |
| RE43,400 E * | 5/2012 | O'Brien | B23K 26/083 219/121.81 |
| 8,932,510 B2 * | 1/2015 | Li | C03B 33/091 264/400 |
| 8,946,590 B2 * | 2/2015 | Li | B23K 26/40 219/121.72 |
| 10,056,285 B2 * | 8/2018 | Jang | H01L 21/6835 |
| 10,283,424 B1 * | 5/2019 | Chen | H01L 22/20 |
| 10,328,529 B2 * | 6/2019 | Finn | B23K 26/382 |
| 10,927,031 B2 * | 2/2021 | Soyama | B28D 1/225 |
| 11,219,966 B1 * | 1/2022 | Donofrio | H01L 21/02686 |
| 11,318,560 B2 * | 5/2022 | Richerzhagen | B26F 1/31 |
| 2001/0054606 A1 * | 12/2001 | Weishauss | H01L 21/78 219/121.74 |
| 2002/0031899 A1 * | 3/2002 | Manor | B23K 26/40 438/460 |
| 2005/0118790 A1 * | 6/2005 | Lee | B28D 5/00 438/460 |
| 2005/0126472 A1 * | 6/2005 | Popescu | B24C 3/322 117/200 |
| 2005/0274702 A1 * | 12/2005 | Deshi | B23K 26/40 219/121.72 |
| 2006/0180579 A1 * | 8/2006 | Popescu | B26B 3/008 219/121.18 |
| 2007/0111481 A1 * | 5/2007 | Tamura | B23K 26/40 257/797 |
| 2009/0086170 A1 * | 4/2009 | El-Ghoroury | H01S 5/18 353/38 |
| 2010/0078768 A1 * | 4/2010 | Dydyk | B23K 26/364 257/E23.179 |
| 2015/0097272 A1 * | 4/2015 | Jang | H01L 21/78 438/107 |
| 2016/0071770 A1 * | 3/2016 | Albermann | H01L 21/02076 257/797 |
| 2016/0276223 A1 * | 9/2016 | Priewasser | H01L 21/6835 |
| 2017/0053832 A1 * | 2/2017 | Wan | H01L 21/78 |
| 2018/0047611 A1 * | 2/2018 | Jang | H01L 21/78 |
| 2018/0061979 A1 * | 3/2018 | Weber | H01L 21/78 |
| 2018/0161924 A1 * | 6/2018 | Werner | B23K 26/0624 |
| 2018/0233410 A1 * | 8/2018 | James | H01L 21/78 |
| 2019/0067049 A1 * | 2/2019 | Cheng | H01L 21/67092 |
| 2019/0164919 A1 * | 5/2019 | Hu | H01L 23/544 |
| 2019/0259709 A1 * | 8/2019 | Blank | H01L 23/3157 |
| 2020/0006176 A1 * | 1/2020 | Tsai | H01L 23/562 |
| 2020/0051860 A1 * | 2/2020 | Wyant | H01L 21/67092 |
| 2021/0202318 A1 * | 7/2021 | Ko | H01L 25/50 |
| 2021/0375826 A1 * | 12/2021 | Chen | H01L 23/3135 |
| 2021/0375829 A1 * | 12/2021 | Or-Bach | H01L 25/18 |
| 2022/0009035 A1 * | 1/2022 | Subkhangulov | B23K 26/064 |

FOREIGN PATENT DOCUMENTS

| | | | | |
|---|---|---|---|---|
| CN | 112846542 A | * | 5/2021 | ........... B23K 26/064 |
| CN | 213560631 U | * | 6/2021 | ....... H01L 21/67092 |
| CN | 110014227 B | * | 8/2021 | ........... B23K 26/082 |
| TW | 201304067 A | * | 1/2013 | ......... B23K 26/0006 |

* cited by examiner

METHOD OF OPTIMIZING LASER CUTTING OF WAFERS FOR PRODUCING INTEGRATED CIRCUIT DIES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to methods of manufacturing integrated circuits, and in particular, to methods of optimizing laser cutting of wafers in the production of integrated circuit dies.

Description of the Related Art

The manufacture of integrated circuit dies involves separating dies from a wafer of semiconductor following the processing of the wafer. One way of separating dies from the wafer includes laser cutting of the wafer. However, laser processing can result in failures, including delamination of die layers due to stresses generated during laser processing, and corner cracks in the die due to die stress during laser processing. Another way of separating dies is a scribe and break process (e.g., a mechanical process), which can reduce the die yield.

SUMMARY

There is a need for an improved laser processing (e.g., laser dicing, laser cutting) method for wafers that does not have some of the drawbacks of existing laser processing methods.

In accordance with one aspect of the disclosure, a method for laser processing (e.g., laser cutting, laser dicing) of wafers to produce integrated circuit dies is provided that reduces delamination of die layers by at least 90% and improves production capacity (e.g., units per hour) by at least 40%.

In accordance with one aspect of the disclosure, a method of separating integrated circuit dies from a wafer is provided. The method comprises making three cutting passes with a laser along a first die street of an integrated circuit die, the first die street extending along a first axis on the wafer, and making three cutting passes with the laser along a second die street of the integrated circuit die, the second die street extending along a second axis on the wafer that is generally perpendicular to the first axis. The three cutting passes along the first die street are alternatingly made with the three cutting passes along the second die street, to thereby fully separate the integrated circuit die from the wafer along the first and second axes.

In accordance with another aspect of the disclosure, a method of separating integrated circuit dies from a wafer is provided. The method comprises making two cutting passes with a laser along a first die street of an integrated circuit die, the first die street extending along a first axis on the wafer, and making two cutting passes with the laser along a second die street generally perpendicular to the first die street, the second die street extending along a second axis generally perpendicular to the first axis on the wafer. The two cutting passes along the first die street are made before the two cutting passes along the second die street to thereby fully separate the integrated circuit die from the wafer along the first and second die streets.

DETAILED DESCRIPTION

Figure 1:
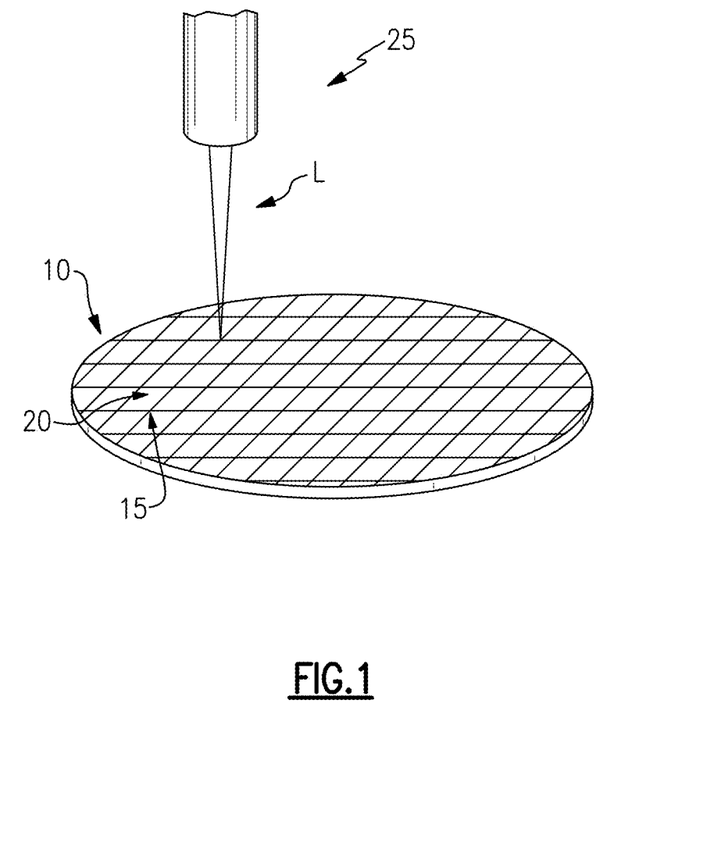
FIG. 1 is a schematic view of a wafer having a plurality of integrated circuit dies.

FIG. 1 shows a semiconductor wafer 10 that can be diced into a plurality of integrated circuit (IC) dies 20 along streets 15 (e.g., die streets, wafer streets) of the wafer 10. One manner of dicing the wafer 10 into the separate IC dies 20 involves use of a laser cutting machine 25 that directs a laser L at the wafer 10. Such laser cutting machines include ones manufactured by ASM Laser Separation International B.V of The Netherlands (hereafter "ALSI"), and ones manufactured by DISCO Corporation of Japan (e.g., hereafter "DISCO").

Figure 2:
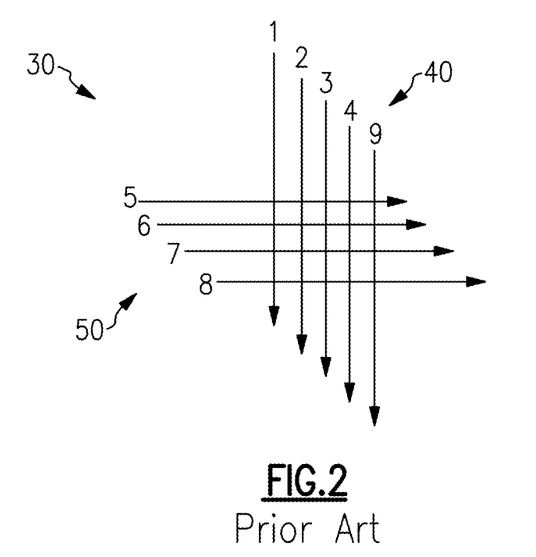
FIG. 2 is a schematic view of a prior art laser cutting strategy for integrated circuit dies.

FIG. 2 shows a conventional schematic view of a laser cutting strategy 30 used with ALSI machines, in which four cutting passes (1, 2, 3, 4) are first made in a Y direction 40, and then four cutting passes (5, 6, 7, 8) are made in an X direction 50, after which a final cutting pass (9) is made in the Y direction 40.

Figure 3:
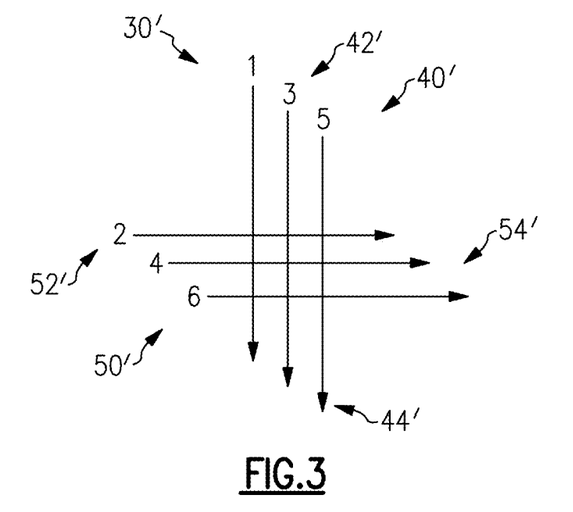
FIG. 3 is a schematic view of an improved laser cutting strategy for integrated circuit dies.

FIG. 3 shows a schematic view of an improved laser cutting strategy 30' used with ALSI machines that requires fewer number of passes than the conventional laser cutting strategy 30 and that advantageously results in improved output of IC dies 20 and improved reduction in defects in the IC dies 20. The laser cutting strategy 30' advantageously minimizes overheating of the corners of the IC die 20 during laser processing, so that fewer corner crack (e.g., chipout) failures are exhibited, while allowing for increased laser power to be used in the processing of the IC dies 20, thereby reducing the number of the laser cutting steps and increasing output of IC dies 20, and resulting in IC dies 20 with cleaner die edges.

The laser cutting strategy 30' includes three passes (1, 3, 5) made in the Y direction 40' and three passes (2, 4, 6) made in the X direction 50', where the passes in the Y direction 40' and in the X direction 50' are made in an alternating manner (e.g., one pass in the Y direction 40', followed by one pass in the X direction 50', etc.).

Figure 4:
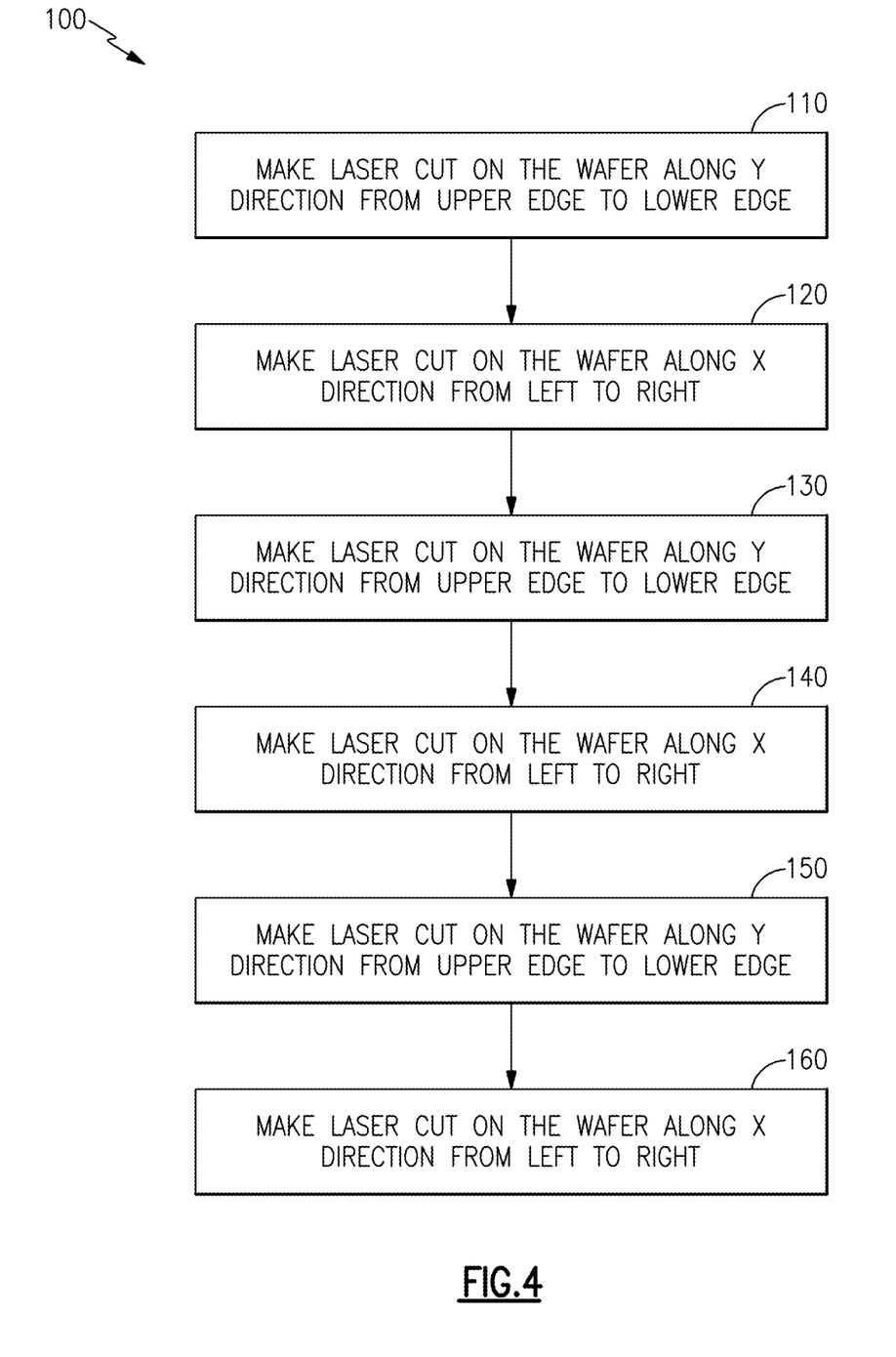
FIG. 4 is a block diagram of the method for laser processing of integrated circuit dies of FIG. 3.

FIG. 4 shows a block diagram of a process 100 for laser processing of IC dies 20 from a wafer 10 using the laser cutting strategy 30'. At block 110, the process makes a laser cut on the wafer 10 along a die street 15A of an IC die 20 in a Y direction 40' from an upper edge 42' to a lower edge 44'. At block 120, the process makes a laser cut on the wafer 10 along a die street 15B of the IC die 20 in an X direction 40' from a left edge 52' of the die 20 to a right edge 54' of the die 20. At block 130, the process makes a laser cut on the wafer 10 along the die street 15A of the IC die 20 in the Y direction 40' from the upper edge 42' to the lower edge 44'. At block 140, the process makes a laser cut on the wafer 10 along the die street 15B of the IC die 20 in the X direction 40' from the left edge 52' of the die 20 to the right edge 54' of the die 20. At block 150, the process makes a laser cut on the wafer 10 along the die street 15A of the IC die 20 in the Y direction 40' from the upper edge 42' to the lower edge 44'. At block 160, the process makes a laser cut on the wafer 10 along the die street 15B of the IC die 20 in the X direction 40' from the left edge 52' of the die 20 to the right edge 54' of the die 20.

Figure 5A:
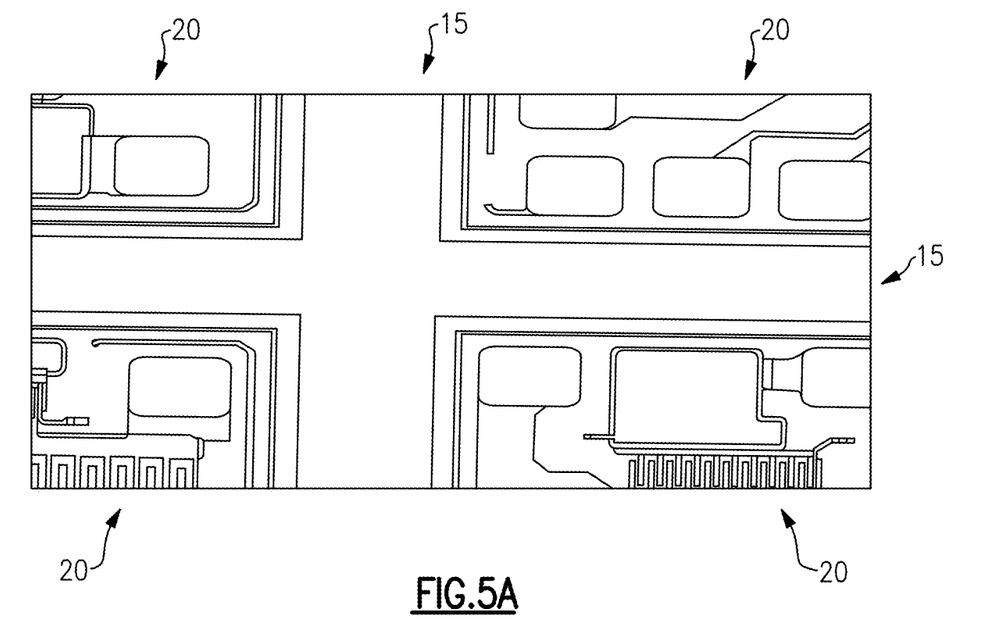
FIG. 5A is a partial top view of a portion of a wafer following one or more laser passes using the improved laser cutting strategy of FIG. 3 and method of FIG. 4.
Figure 5B:
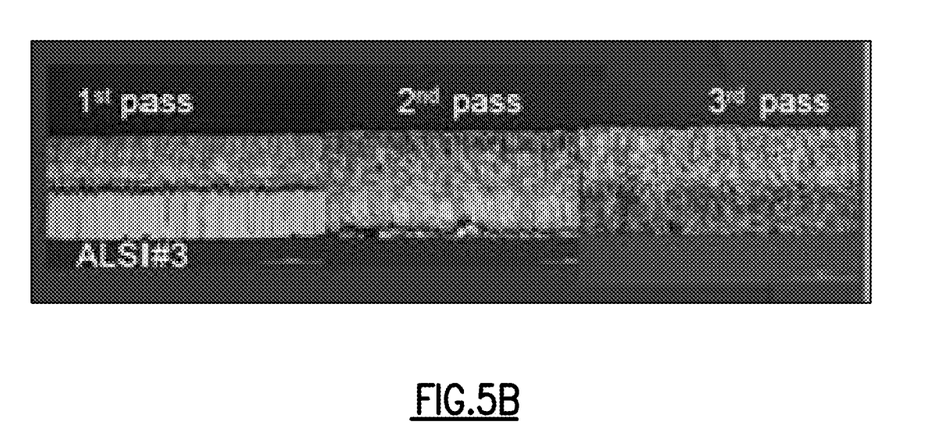
FIG. 5B is an image illustrating a cross-sectional view of a wafer portion of FIG. 5A after each pass of the method of FIG. 4.

FIG. 5A shows a partial top view, and FIG. 5B shows a cross-sectional view, of a wafer 10 along one axis X, Y during different passes 40', 50' of the laser during cutting of the die 20 using an ALSI laser cutting machine and using the strategy laser cutting strategy 30' As shown in FIG. 5B, the die 20 is fully cut along the die street 15 after three passes.

Figure 6:
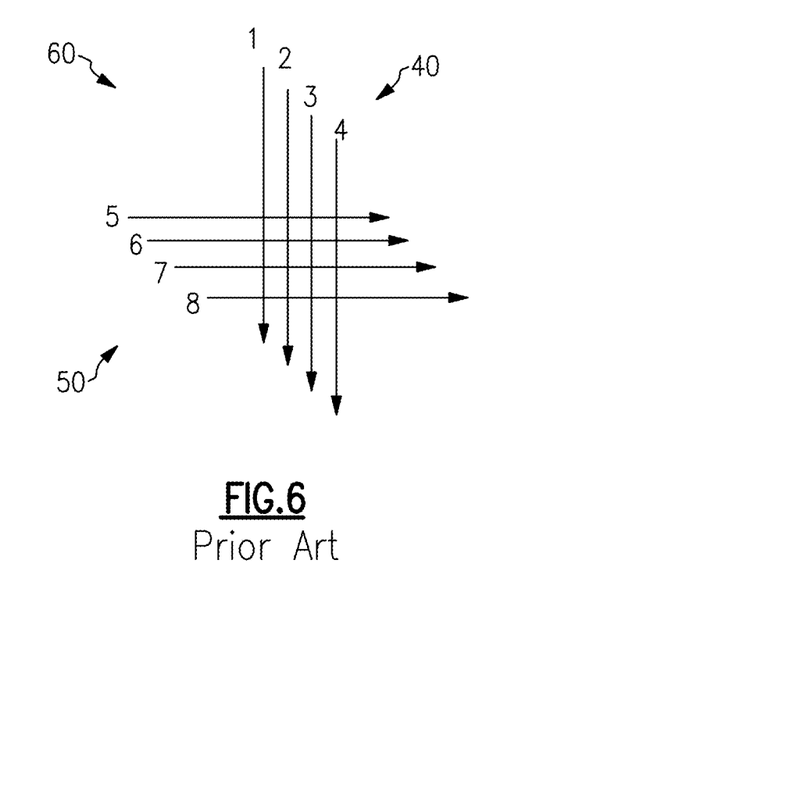
FIG. 6 is a schematic view of a prior art laser cutting strategy for integrated circuit dies.

FIG. 6 shows a conventional schematic view of a laser cutting strategy 60 used with DISCO machines, in which four cutting passes (1, 2, 3, 4) are first made in the Y direction 40, and then four cutting passes (5, 6, 7, 8) are made in the X direction 50.

Figure 7:
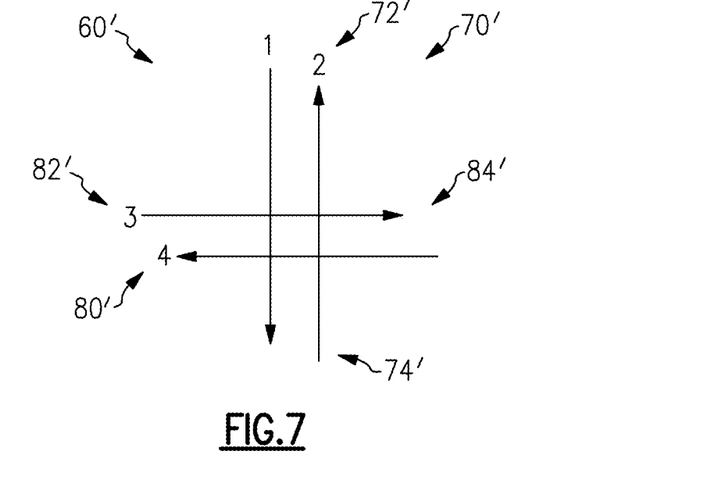
FIG. 7 is an improved laser cutting strategy for integrated circuit dies.

FIG. 7 shows a schematic view of an improved laser cutting strategy 60' used with DISCO machines that requires fewer number of passes than the conventional laser cutting strategy 60 and that advantageously results in improved output of IC dies 20 and improved reduction in defects in the IC dies 20. The laser cutting strategy 60' advantageously minimizes overheating of the corners of the IC die 20 during laser processing, so that fewer corner crack (e.g., chipout) failures are exhibited, while allowing for increased laser power to be used in the processing of the IC dies 20, thereby reducing the number of the laser cutting steps and increasing output of IC dies 20, and resulting in IC dies 20 with cleaner die edges.

The laser cutting strategy 60' includes two passes (1, 2) made in the Y direction 70' and two passes (3, 4) made in the X direction 80', where both passes (1, 2) in the Y direction 70' are made first, followed by both passes (3, 4) and in the X direction 80'.

Figure 8:
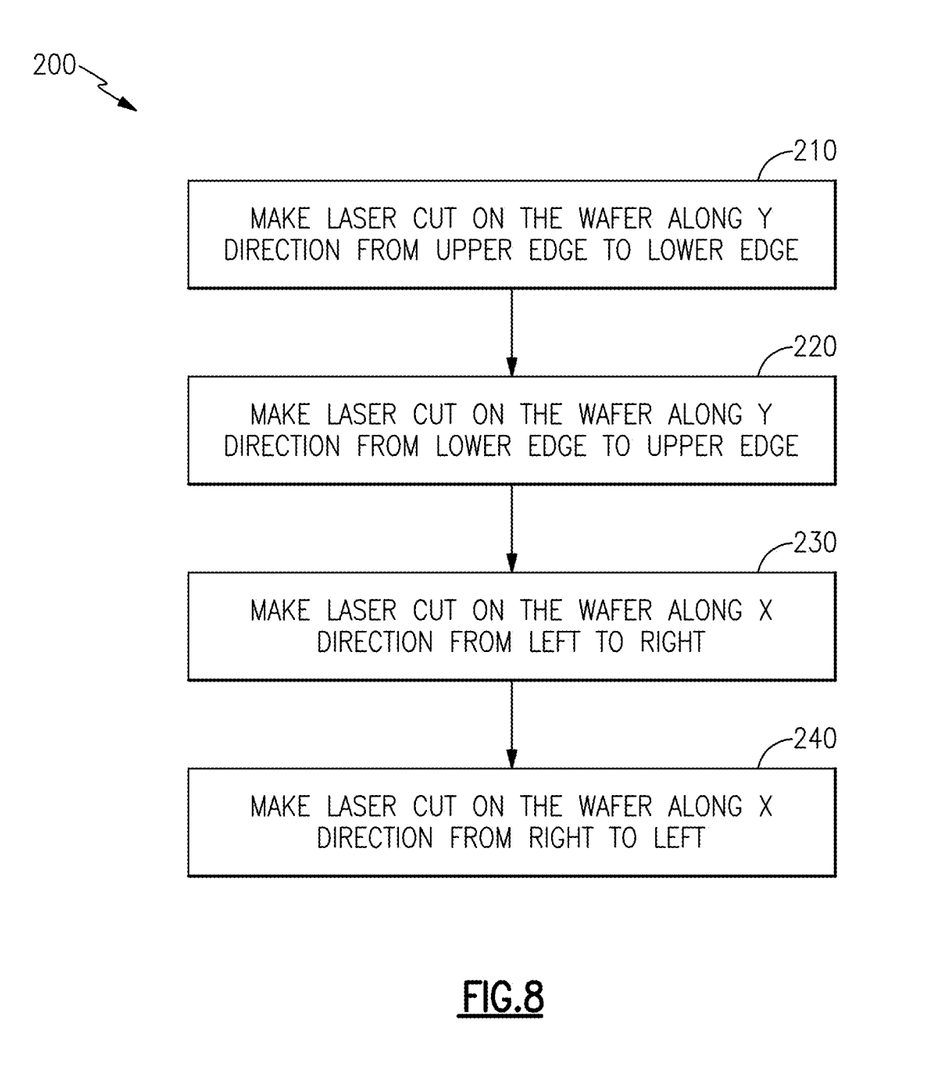
FIG. 8 is a block diagram of the method for laser processing of integrated circuit dies of FIG. 7.

FIG. 8 shows a block diagram of a process 200 for laser processing of IC dies 20 from a wafer 10 using the laser cutting strategy 60'. At block 210, the process makes a laser cut on the wafer 10 along a die street 15A of an IC die 20 in a Y direction 70' from an upper edge 72' of the IC die 20 to a lower edge 74' of the IC die 20. At block 220, the process makes a laser cut on the wafer 10 along the die street 15A of the IC die 20 in the Y direction 70' from the lower edge 74' of the IC die 20 to the upper edge 72' of the IC die 20. At block 230, the process makes a laser cut on the wafer 10 along the die street 15B of the IC die 20 in an X direction 80' from a left edge 82' of the IC die 20 to a right edge 84' of the IC die 20. At block 240, the process makes a laser cut on the wafer 10 along the die street 15B of the IC die 20 in the X direction 80' from the right edge 84' of the IC die 20 to the left edge 82' of the IC die 20.

Table 1 shows parameters of the laser utilized for the conventional laser cutting strategies 30, 60, including the thickness (in mils) of the wafer 10, the power level of the laser used during the cutting process, the speed at which the laser moved over the wafer 10, and the number of passes in each of the X and Y directions (e.g., 3.5 passes in the X direction, 3.5 passes in Y direction) used during the dicing of the IC dies 20 from the wafer 10.

TABLE 1

Conventional Process for Cutting IC Dies from a Wafer

| Machine | Thickness (mils) | Power (Watts) | Speed (mm/s) | Passes (X-Y) |
|---|---|---|---|---|
| ALSI | 4 | 4.5 | 185 | 3.5 |
| ALSI | 5 | 4.5 | 185 | 3.5 |
| ALSI | 8 | 5 | 185 | 4.5 |
| DISCO | 4 | 4.75 | 250 | 4 |
| DISCO | 5 | 5.5 | 250 | 4 |
| DISCO | 8 | 7.5 | 250 | 4 |

Table 2 shows parameters of the laser utilized for the improved laser cutting strategies 30', 60', including the thickness (in mils) of the wafer 10, the power level of the laser used during the cutting process, the speed at which the laser moved over the wafer 10, and the number of passes in each of the X and Y directions (e.g., 2 passes in the X direction, 2 passes in Y direction) used during the dicing of the IC dies 20 from the wafer 10.

TABLE 2

Process for Cutting IC Dies from a Wafer

| Machine | Thickness (mils) | Power (Watts) | Speed (mm/s) | Passes (X-Y) |
|---|---|---|---|---|
| ALSI | 4 | 4.5 | 174 | 2 |
| ALSI | 5 | 4.5 | 174 | 2 |
| ALSI | 8 | 5.5 | 174 | 3 |
| DISCO | 4 | 4.75 | 225 | 2 |
| DISCO | 5 | 7.25 | 225 | 2 |
| DISCO | 8 | 9.5 | 225 | 2 |

Table 3 shows results of different tests conducted using an ALSI machine with the improved laser cutting strategy 30' at different power levels using a wafer 10 having a thickness of 8 mils. As shown on Table 3, power levels of 5 W, 5.5 W and 6.0 W all showed good separation in both axes (e.g., X and Y axes), but the test using 6.0 W laser power started showing burn marks on the IC die 20. Additionally, the cycle time for processing (e.g., cutting) the IC dies 20 from the wafer 10 with the 5.5 W laser power (with 3 passes in X and Y directions, as shown in Table 2 above) was approximately 12 minutes, which is a reduction of approximately 55% from the cycle time of 22 minutes with the conventional laser cutting strategies previously used with an ALSI machine (e.g., using a 5.0 W power and 4.5 passes in X and Y direction, as shown in Table 1).

TABLE 3

Process for Cutting IC Dies from a Wafer

| Passes (X-Y) | Power (Watts) | Result |
|---|---|---|
| 3 | 4.5 | Material unmolded at X axis |
| 3 | 5 | Good separation on both axes |
| 3 | 5.5 | Good separation on both axes |
| 3 | 6.0 | Good separation on both axes, but start showingburn marks |

Accordingly, the improved laser cutting strategies or methods 30', 60', including the optimization of the power of the laser used to dice the wafer 10, advantageously reduced the cycle time for processing IC dies 20 from wafers 10 by 55%, thereby increasing the output (e.g., units per hour) of IC dies 20 (e.g., increase units per hour by approximately 55%). Additionally, the improved laser cutting strategies or methods 30', 60' advantageously reduced delamination issues in the IC dies 20 by approximately 90%, thereby increasing the yield of IC dies 20. Further, the improved laser cutting strategies 30', 60' advantageously exhibited no impact on dicing quality in the IC dies 20 (e.g., as shown in FIG. 5, the IC die 20 was fully cut along both axes without showing burn marks). Additionally, the improvements provided by the laser cutting strategies or methods 30', 60' advantageously facilitated the processing of IC dies 20 utilizing only laser cutting machines (e.g., ALSI or DISCO machines), and allowed the nonuse of mechanical (e.g., diamond cutting) scribe and break machines.

Figure 9A:
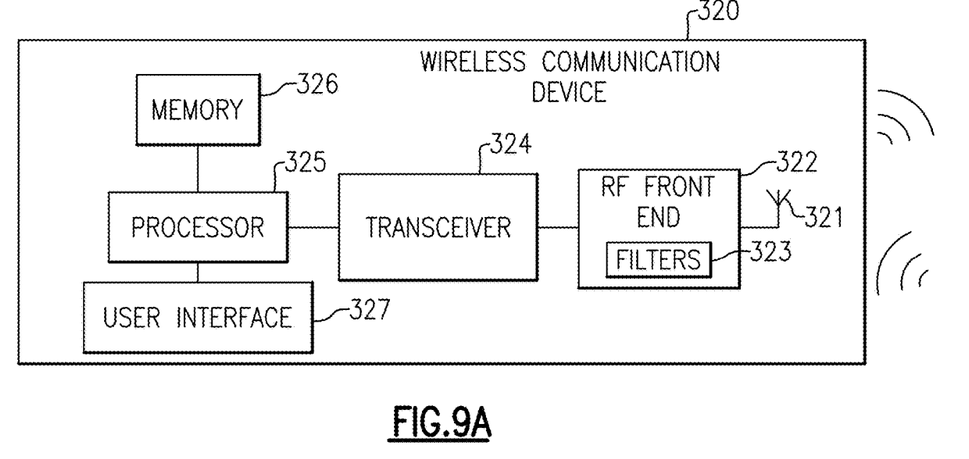
FIG. 9A is a schematic block diagram of a wireless communication device that includes an integrated circuit die in accordance with one or more embodiments.

FIG. 9A is a schematic diagram of a wireless communication device 320 that includes filters 323 in a radio frequency front end 322 according to an embodiment. The filters 323 can include one or more SAW resonators. The wireless communication device 320 can be any suitable wireless communication device. For instance, a wireless communication device 320 can be a mobile phone, such as a smart phone. As illustrated, the wireless communication device 320 includes an antenna 321, an RF front end 322, a transceiver 324, a processor 325, a memory 326, and a user interface 327. The antenna 321 can transmit/receive RF signals provided by the RF front end 322. Such RF signals can include carrier aggregation signals. Although not illustrated, the wireless communication device 320 can include a microphone and a speaker in certain applications.

The RF front end 322 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 322 can transmit and receive RF signals associated with any suitable communication standards. The filters 323 can include SAW resonators of a SAW component that includes any suitable combination of features discussed with reference to any embodiments discussed above.

The transceiver 324 can provide RF signals to the RF front end 322 for amplification and/or other processing. The transceiver 324 can also process an RF signal provided by a low noise amplifier of the RF front end 322. The transceiver 324 is in communication with the processor 325. The processor 325 can include an IC die, such as an IC die made in accordance with the methods disclosed herein. The processor 325 can be a baseband processor. The processor 325 can provide any suitable base band processing functions for the wireless communication device 320. The memory 326 can be accessed by the processor 325. The memory 326 can store any suitable data for the wireless communication device 320. The user interface 327 can be any suitable user interface, such as a display with touch screen capabilities.

Figure 9B:
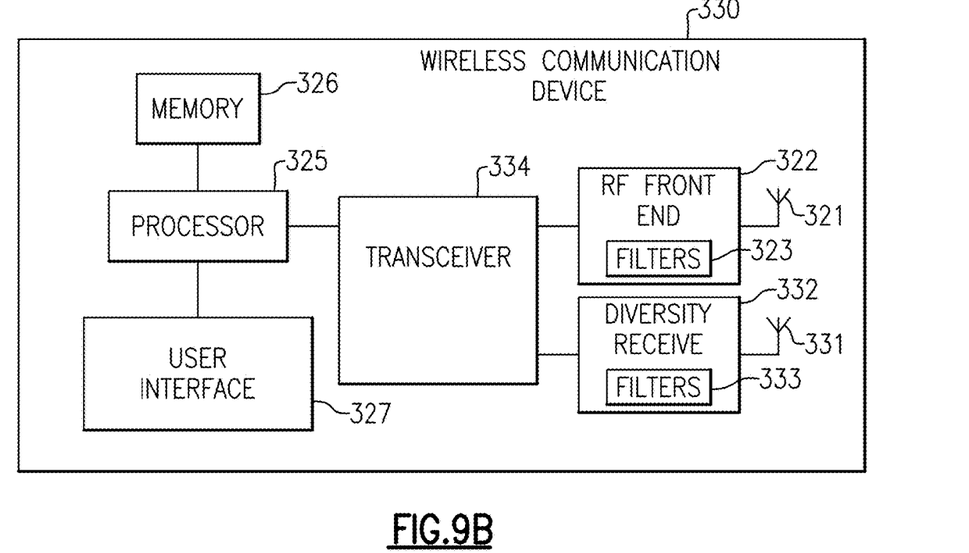
FIG. 9B is a schematic block diagram of another wireless communication device that includes an integrated circuit die in accordance with one or more embodiments.

FIG. 9B is a schematic diagram of a wireless communication device 330 that includes filters 323 in a radio frequency front end 322 and a second filter 333 in a diversity receive module 332. The wireless communication device 330 is like the wireless communication device 320 of FIG. 9A, except that the wireless communication device 330 also includes diversity receive features. As illustrated in FIG. 9B, the wireless communication device 330 includes a diversity antenna 331, a diversity module 332 configured to process signals received by the diversity antenna 331 and including filters 333, and a transceiver 334 in communication with both the radio frequency front end 322 and the diversity receive module 332. The filters 333 can include one or more SAW resonators that include any suitable combination of features discussed with reference to any embodiments discussed above.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. For example, one portion of one of the embodiments described herein can be substituted for another portion in another embodiment described herein. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A method of separating an integrated circuit die from a wafer, comprising:
    making two cutting passes with a laser consecutively in opposite up and down directions along a first die street of an integrated circuit die, the first die street extending along a first axis on the wafer; and
    making two separate cutting passes with the laser consecutively in opposite left and right directions along a second die street generally perpendicular to the first die street, the second die street extending along a second axis generally perpendicular to the first axis on the wafer, the two cutting passes along the first die street being made before the two separate cutting passes along the second die street to thereby fully separate the integrated circuit die from the wafer along the first and second die streets, the making of the two cutting passes and the two separate cutting passes with the laser along the first die street and along the second die street, respectively, including cutting with the laser at a same power level for the two cutting passes along the first die street and for the two separate cutting passes along the second die street.

2. The method of claim 1 wherein the first of the two cutting passes made along the first die street is made from an upper edge to a lower edge of the integrated circuit die, and wherein the second of the two cutting passes made along the first die street is made from the lower edge to the upper edge of the integrated circuit die.

3. The method of claim 1 wherein the first of the two cutting separate passes made along the second die street is made from a left edge to a right edge of the integrated circuit die, and wherein the second of the two separate cutting passes made along the second die street is made from the right edge to the left edge of the integrated circuit die.

4. The method of claim 1 wherein making the two cutting passes with the laser along the first die street and making the two separate cutting passes along the second die street on the wafer includes cutting with the laser at a power of approximately 5.5 watts.

5. The method of claim 1 wherein processing of the wafer to separate all integrated circuit dies on the wafer takes approximately 12 minutes.

6. The method of claim 1 wherein delamination defects in the separated integrated circuit die are reduced by approximately 90%.

7. A method of separating an integrated circuit die from a wafer, comprising:
    making two cutting passes in opposite directions with a laser consecutively along a first die street of an integrated circuit die, the first die street extending along a first axis on the wafer; and
    making two separate cutting passes in opposite directions with the laser consecutively along a second die street generally perpendicular to the first die street, the second die street extending along a second axis generally perpendicular to the first axis on the wafer, the two cutting passes along the first die street being made before the two separate cutting passes along the second die street to thereby fully separate the integrated circuit die from the wafer along the first and second die streets, the making of the two cutting passes and the two separate cutting passes with the laser along the first die street and along the second die street, respectively, including cutting with the laser at a same power level for the two cutting passes along the first die street and for the two separate cutting passes along the second die street.

8. The method of claim 7 wherein making the two cutting passes with the laser along the first die street and making the two separate cutting passes along the second die street on the wafer includes cutting with the laser at a power of approximately 5.5 watts.

9. The method of claim 7 wherein processing of the wafer to separate all integrated circuit dies on the wafer takes approximately 12 minutes.

10. The method of claim 7 wherein delamination defects in the separated integrated circuit die are reduced by approximately 90%.

11. A method of separating an integrated circuit die from a wafer, comprising:
making only two linear cutting passes in opposite directions with a laser consecutively along a first die street of an integrated circuit die, the first die street extending along a first axis on the wafer; and
making only two separate linear cutting passes in opposite directions with the laser consecutively along a second die street generally perpendicular to the first die street, the second die street extending along a second axis generally perpendicular to the first axis on the wafer, the two linear cutting passes along the first die street being made consecutively and before the two separate linear cutting passes along the second die street to thereby fully separate the integrated circuit die from the wafer along the first and second die streets, the making of the two linear cutting passes and the two separate linear cutting passes with the laser along the first die street and along the second die street, respectively, including cutting with the laser at a same power level for the two linear cutting passes along the first die street and for the two separate linear cutting passes along the second die street.

12. The method of claim 11 wherein making the two linear cutting passes with the laser along the first die street and making the two separate linear cutting passes along the second die street on the wafer includes cutting with the laser at a power of approximately 5.5 watts.

13. The method of claim 11 wherein processing of the wafer to separate all integrated circuit dies on the wafer takes approximately 12 minutes.

14. The method of claim 11 wherein delamination defects in the separated integrated circuit die are reduced by approximately 90%.

* * * * *